(12) United States Patent
Kamizono et al.

(10) Patent No.: US 9,190,276 B2
(45) Date of Patent: Nov. 17, 2015

(54) METHOD OF DIFFUSING IMPURITY-DIFFUSING COMPONENT AND METHOD OF MANUFACTURING SOLAR CELL

(71) Applicant: Tokyo Ohka Kogyo Co., Ltd., Kawasaki-shi (JP)

(72) Inventors: Takashi Kamizono, Kawasaki (JP); Motoki Takahashi, Kawasaki (JP); Toshiro Morita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 112 days.

(21) Appl. No.: 13/951,121

(22) Filed: Jul. 25, 2013

(65) Prior Publication Data
US 2014/0030839 A1 Jan. 30, 2014

(30) Foreign Application Priority Data

Jul. 26, 2012 (JP) .................................. 2012-166196
Jun. 20, 2013 (JP) .................................. 2013-129915

(51) Int. Cl.
*H01L 21/00* (2006.01)
*H01L 21/22* (2006.01)
*H01L 31/18* (2006.01)
*H01L 31/0288* (2006.01)
*H01L 31/068* (2012.01)
*H01L 21/225* (2006.01)

(52) U.S. Cl.
CPC ............ *H01L 21/22* (2013.01); *H01L 21/2225* (2013.01); *H01L 21/2254* (2013.01); *H01L 31/0288* (2013.01); *H01L 31/0682* (2013.01); *H01L 31/18* (2013.01); *H01L 31/1804* (2013.01); *Y02E 10/547* (2013.01)

(58) Field of Classification Search
CPC ............ H01L 29/7869; H01L 27/1225; H01L 31/0481; H01L 51/0085; H01L 51/5016; H01L 51/5206; H01L 51/56; H01L 21/31144; H01L 27/307; H01L 29/205; H01L 31/022425; H01L 31/03046; H01L 31/035236
USPC ......... 257/40, E31.061, E21.135; 438/57, 87, 438/98, 542, 558
See application file for complete search history.

(56) References Cited

U.S. PATENT DOCUMENTS

2011/0108095 A1* 5/2011 Takahashi et al. ............ 136/252
2012/0222734 A1* 9/2012 Kano et al. .................... 136/255

FOREIGN PATENT DOCUMENTS

JP           A-2012-114452      6/2012

* cited by examiner

*Primary Examiner* — Mark A Laurenzi
(74) *Attorney, Agent, or Firm* — Knobbe, Martens, Olson & Bear, LLP

(57) ABSTRACT

A method of diffusing an impurity-diffusing component including forming a first diffusing agent layer containing a first conductivity type impurity-diffusing component on the surface of a semiconductor substrate; calcining the first diffusing agent layer; forming a second diffusing agent layer containing a second conductivity type impurity-diffusing component on the surface of the semiconductor substrate excluding the region where the first diffusing agent layer is formed; and heating the semiconductor substrate at a temperature higher than the calcination temperature to diffuse the first and second conductivity type impurity-diffusing components to the semiconductor substrate.

13 Claims, 3 Drawing Sheets

METHOD OF DIFFUSING IMPURITY-DIFFUSING COMPONENT AND METHOD OF MANUFACTURING SOLAR CELL

RELATED APPLICATIONS

This application claims priority under 35 U.S.C. §119(a)-(d) to Japanese Patent Application No. 2012-166196, filed Jul. 26, 2012; and Japanese Patent Application No. 2013-129915, filed Jun. 20, 2013, the entire contents of which are incorporated herein by reference.

BACKGROUND OF THE INVENTION

1. Field of the Invention

The present invention relates to a method of diffusing an impurity-diffusing component and a method of manufacturing a solar cell.

2. Description of the Related Art

In semiconductor manufacturing fields, particularly in solar cell manufacturing fields, aiming at an improvement in manufacturing throughput, there has been recently a need for a technique of simultaneously diffusing a P-type impurity-diffusing component containing boron and an N-type impurity-diffusing component containing phosphorus in a semiconductor substrate to selectively form a P-type impurity diffusion layer and an N-type impurity diffusion layer on the semiconductor substrate. In the conventional method of manufacturing a semiconductor substrate having P-type and N-type impurity diffusion layers, an impurity diffusion layer has been formed by using phosphoryl chloride ($POCl_3$) and boron tribromide ($BBr_3$) as impurity-diffusing components and separately subjecting the components to gaseous diffusion. It has been impossible to selectively and simultaneously diffuse boron and phosphorus in a semiconductor substrate by such gaseous diffusion.

On the other hand, for example, Japanese Patent Application Laid-Open (JP-A) No. 2012-114452 discloses a technique of selectively printing a coating liquid of a p-type dopant source and a coating liquid of an N-type dopant source on a substrate by an ink jet printing method or a screen printing method to form each conductivity type of dispersing agent pattern, and diffusing impurity-diffusing components from each of the dispersing agent patterns to selectively form each conductivity type of impurity diffusion layer.

PRIOR ART DOCUMENT

Patent Document

[Patent Document 1] Japanese Patent Application Laid-Open (JP-A) No. 2012-114452

The present inventors have been dedicated to making repetitive studies as to the process of selectively and simultaneously diffusing different conductivity types of the impurity-diffusing components. As a result, they have recognized that the above conventional method has the following problem. Hence, when P-type and N-type dispersing agent patterns are formed on a semiconductor substrate, each of the dispersing agent patterns is heated, and the impurity-diffusing components are simultaneously diffused, so-called out diffusion such that the impurity-diffusing components are flown from the dispersing agent patterns to the outside, and the impurity-diffusing components are diffused in a substrate region where the diffusion is not intended might happened in some cases. The out diffusion may cause a decrease in accuracy when selectively and simultaneously diffusing different conductivity types of the impurity-diffusing components in a substrate.

SUMMARY OF THE INVENTION

The present invention has been made based on the recognition by the present inventors. The object is to provide a technique capable of selectively and simultaneously diffusing different conductivity types of the impurity-diffusing components in a substrate with higher accuracy.

In order to solve the problems, an aspect of the present invention is a method of diffusing an impurity-diffusing component. The method of diffusing an impurity-diffusing component includes: forming a first diffusing agent layer containing a first conductivity-type impurity diffusing component on the surface of a semiconductor substrate; calcining the first diffusing agent layer; forming a second diffusing agent layer containing a second conductivity-type impurity diffusing component on the surface of the semiconductor substrate excluding a region where the first diffusing agent layer is formed; and heating the semiconductor substrate at a temperature higher than a calcination temperature to diffuse the first conductivity-type impurity diffusing component and the second conductivity-type impurity diffusing component into the semiconductor substrate.

Another aspect of the present invention is a method of manufacturing a solar cell. The method of manufacturing a solar cell includes: using the above method of diffusing an impurity-diffusing component to diffuse the first conductivity-type impurity diffusing component and the second conductivity-type impurity diffusing component into the semiconductor substrate, and to form a first conductivity-type first impurity diffusion layer and a second conductivity-type second impurity diffusion layer on the surface of the semiconductor substrate; and forming a first electrode and a second electrode on the surface of the semiconductor substrate, electrically connecting the first electrode to the first impurity diffusion layer, and electrically connecting the second electrode to the second impurity diffusion layer.

DETAILED DESCRIPTION OF THE INVENTION

Figure 1A:
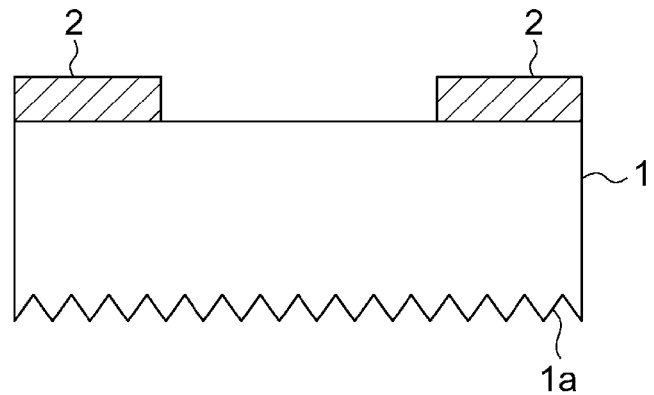
FIGS. 1A to 1C are flow charts of the method of diffusing an impurity-diffusing component and the method of manufacturing a solar cell according to an embodiment.

The invention will now be described by reference to the preferred embodiments. This does not intend to limit the scope of the present invention, but to exemplify the invention.

Hereinafter, the present invention will be described with reference to the drawings based on the preferred embodiments. In the drawings, the same or equivalent constituent elements, members, and processes as those in the embodiments are denoted by the same reference numerals and their descriptions will not be repeated. Further, the embodiments do not intend to limit the scope of the present invention, but to exemplify the invention. It should be understood that not all of the features and the combination thereof discussed in the embodiments are essential to the invention.

The method of diffusing an impurity-diffusing component and the method of manufacturing a solar cell according to the embodiment will be described with reference to FIGS. 1A to 1C and FIGS. 2A to 2D. FIGS. 1A to 1C and FIGS. 2A to 2D are flow charts of the method of diffusing an impurity-diffusing component and the method of manufacturing a solar cell according to an embodiment.

<Preparation of P-type Diffusing Agent Composition>

A P-type diffusing agent composition contains borate ester as a P-type (first conductivity-type) impurity-diffusing component (A1), polyhydric alcohol (B), and an alkoxy silane compound (C). Further, the P-type diffusing agent composition contains an organic solvent (D) as an optional component. Hereinafter, the components of the P-type diffusing agent composition will be described in detail.

<Borate Ester as P-type Impurity-diffusing Component (A1)>

Borate ester is a compound of an element of Group III (Group 13) and contains boron as the P-type impurity-diffusing component. In the case of the borate ester, a P-type impurity diffusion layer (impurity diffusion region) can be formed in an N-type semiconductor substrate, and a $P^+$-type (high concentration P type) impurity diffusion layer can be formed in a P-type semiconductor substrate. The content of the borate ester in the P-type diffusing agent composition is appropriately adjusted depending on the thickness of the impurity diffusion layer to be formed on the semiconductor substrate. For example, the content of the borate ester is preferably 0.1% by mass or more, more preferably 1.0% by mass or more based on the total mass of the P-type diffusing agent composition. The content of the borate ester is preferably 50% by mass or less based on the total mass of the P-type diffusing agent composition. The content of boron atoms in the borate ester is preferably 0.01 to 10% by mass, more preferably 0.1 to 3% by mass based on the total mass of the P-type diffusing agent composition.

In the present embodiment, borate ester has the structure represented by Formula (1) below.

$$B(OR^1)_3 \quad (1)$$

[where $R^1$ independently represent an alkyl group having 1 to 10 carbon atoms or an aryl group having 6 to 10 carbon atoms. Three $R^1$s may be the same or different.]

When $R^1$ is an alkyl group, a linear or branched alkyl group having 1 to 4 carbon atoms is more preferred. The aryl group is, for example, a phenyl group or a naphthyl group. The alkyl group and the aryl group may have a substituent.

Specific examples of the borate ester include trimethyl borate, triethyl borate, tripropyl borate, tributyl borate, tripentyl borate, trihexyl borate, trioctyl borate, and triphenyl borate. Among the borate esters, trimethyl borate and triethyl borate are preferred from the viewpoint of more easily obtaining an effect of suppressing aggregation and precipitation. These borate esters may be used alone or in combination of two or more of them.

<Polyhydric Alcohol (B)>

Polyhydric alcohol (B) is represented by Formula (2) below.

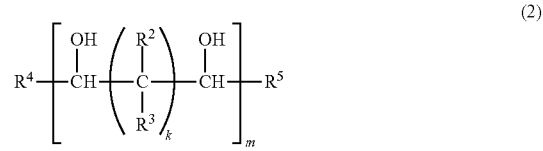

[where k represents an integer of 0 to 3. m represents an integer of 1 or more. $R^2$ and $R^3$ independently represent a hydrogen atom, a hydroxyl group, an alkyl group having 1 to 5 carbon atoms or a hydroxyalkyl group having 1 to 5 carbon atoms. When there are a plurality of $R^2$s and a plurality of $R^3$s, the plurality of $R^2$s and the plurality of $R^3$s may be the same or different. When k is 2 or more, the plurality of $R^2$s and the plurality of $R^3$s necessarily include at least one hydroxyl group or a hydroxyalkyl group having 1 to 5 carbon atoms. $R^4$ and $R^5$ independently represent a hydrogen atom or an alkyl group having 1 to 3 carbon atoms.]

Specific examples of the polyhydric alcohol (B) include ethylene glycol, propylene glycol, 1,3-butanediol, trimethylolpropane, 3-methylpentane-1,3,5-triol, and mannitol. These polyhydric alcohols may be used alone or in combination of two or more of them.

When the P-type impurity-diffusing component in the form of borate ester is contained in the P-type diffusing agent composition, and the polyhydric alcohol (B) having a specific structure is contained in the P-type diffusing agent composition, the polyhydric alcohol (B) and the borate ester efficiently form a complex in the P-type diffusing agent composition. As a result, hydrolysis of the borate ester is suppressed. Thus, it is considered that the aggregation and precipitation of the boron compound can be suppressed. Further, the aggregation and precipitation of the boron compound can be suppressed and thus it is possible to suppress the out diffusion in which the boron is flown from the coat of the P-type diffusing agent composition on the semiconductor substrate toward the outside of the coat, and adhered to an adjacent substrate or areas uncoated with the diffusing agent composition, resulting in diffusion.

In the content ratio of the borate ester and the polyhydric alcohol (B) in the P-type diffusing agent composition, the content of the borate ester is preferably 5-fold mol or less, more preferably 2-fold mol or less based on the polyhydric alcohol (B). From the viewpoint that the borate ester can effectively form a complex, the content of the polyhydric alcohol (B) is higher than the content of the borate ester, namely, the content of the borate ester is further preferably less than 1-fold mole relative to the content of the polyhydric alcohol (B).

<Alkoxy Silane Compound (C)>

The alkoxysilane compound (C) contains a reaction product (C1) obtained by hydrolyzing alkoxysilane represented by Formula (3) below.

$$R^6{}_n Si(OR^7)_{4-n} \quad (3)$$

[where $R^6$ represents a hydrogen atom or an organic group. $R^7$ is an organic group. n represents an integer of 0, 1 or 2. When there are a plurality of $R^6$s, the plurality of $R^6$s may be the same or different. When there are a plurality of $(OR^7)$s, the plurality of $(OR^7)$s may be the same or different.]

Examples of the organic groups of $R^6$s and $R^7$s may include an alkyl group, an aryl group, an allyl group, and a glycidyl group. Among them, alkyl and aryl groups are preferred. More preferably, the organic groups of $R^6$s are, for example, linear or branched alkyl groups having 1 to 20 carbon atoms. From the viewpoint of reactivity, they are still more preferably linear or branched alkyl groups having 1 to 4 carbon atoms. At least one of $R^6$s is preferably an alkyl group or an aryl group. Preferably, the aryl group is, for example, an aryl group having 6 to 20 carbon atoms. Examples thereof include a phenyl group and naphthyl group. More preferably, the organic groups of $R^7$s are, for example, linear or branched alkyl groups having 1 to 5 carbon atoms. From the viewpoint of reactivity, they are still more preferably alkyl groups having 1 to 3 carbon atoms. Preferably, the aryl group is, for example, an aryl group having 6 to 20 carbon atoms. Examples thereof include a phenyl group and naphthyl group.

When n in Formula (3) above is 0, the alkoxysilane (i) is represented by, for example, Formula (4) below.

$$Si(OR^{21})_a(OR^{22})_b(OR^{23})_c(OR^{24})_d \qquad (4)$$

[where $R^{21}$, $R^{22}$, $R^{23}$, and $R^{24}$ independently represent the same organic group as the above $R^7$. a, b, c, and d are integers satisfying the following conditions: $0 \le a \le 4$, $0 \le b \le 4$, $0 \le c \le 4$, and $0 \le d \le 4$; and $a+b+c+d=4$.]

Specific examples of the alkoxysilane (i) include tetraalkoxysilane such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane. Among them, tetramethoxysilane and tetraethoxysilane are preferred from the viewpoint of the reactivity.

When n in Formula (3) above is 1, the alkoxysilane (ii) is represented by, for example, Formula (5) below.

$$R^{31}Si(OR^{32})_e(OR^{33})_f(OR^{34})_g \qquad (5)$$

[where $R^{31}$ represents the same hydrogen atom or organic group as the above $R^6$. $R^{32}$, $R^{33}$, and $R^{34}$ independently represent the same organic group as the above $R^7$. e, f, and g are integers satisfying the following conditions: $0 \le e \le 3$, $0 \le f \le 3$; and $0 \le g \le 3$, and $e+f+g=3$.]

Specific examples of the alkoxysilane (ii) include methyltrimetoxysilane, methyltriethoxysilane, methyl tripropoxy silane, methyltributoxysilane, methyl tripentyloxysilane, ethyltrimethoxysilane, ethyltriethoxysilane, ethyltripropoxy silane, ethyltributoxysilane, ethyltripentyloxysilane, ethyltriphenyloxysilane, propyltrimethoxysilane, propyltriethoxysilane, propyltributoxysilane, propyltripentyloxysilane, propyltriphenyloxysilane, butyltrimethoxysilane, butyltriethoxysilane, butyltripropoxysilane, butyltributoxysilane, butyltripentyloxysilane, butyltriphenyloxysilane, methylmonomethoxydiethoxysilane, ethylmonomethoxydiethoxysilane, propylmonomethoxydiethoxysilane, butylmonomethoxydiethoxysilane, methylmonomethoxydipropoxysilane, methylmonomethoxydipentyloxysilane, methylmonomethoxydiphenyloxysilane, ethylmonomethoxydipropoxysilane, ethylmonomethoxydipentyloxysilane, ethylmonomethoxydiphenyloxysilane, propylmonomethoxydipropoxysilane, propylmonomethoxydipentyloxysilane, propylmonomethoxydiphenyloxysilane, butylmonomethoxydipropoxysilane, butylmonomethoxydipentyloxysilane, butylmonomethoxydiphenyloxysilane, methylmethoxyethoxypropoxysilane, propylmethoxyethoxypropoxysilane, butylmethoxyethoxypropoxysilane, methylmonomethoxymonoethoxymonobutoxysilane, ethylmonomethoxymonoethoxymonobutoxysilane, propylmonomethoxymonoethoxymonobutoxysilane, and butylmonomethoxymonoethoxymonobutoxysilane. Among them, methyltrialkoxysilane (particularly, methyltrimetoxysilane, methyltriethoxysilane) is preferred from the viewpoint of the reactivity. The alkyl or alkoxy group having 3 carbon atoms or more in the above-described specific examples may be linear or branched. The butyl (or butoxy) group is preferably an n-butyl (n-butoxy) group. The same holds for the following specific examples.

When n in Formula (3) above is 2, the alkoxysilane (iii) is represented by, for example, Formula (6) below.

$$R^{41}R^{42}Si(OR^{43})_h(OR^{44})_i \qquad (6)$$

[where $R^{41}$ and $R^{42}$ represent the same hydrogen atom or organic group as the above $R^6$. $R^{43}$ and $R^{44}$ independently represent the same organic group as the above $R^7$. h and i are integers satisfying the following conditions: $0 \le h \le 2$; $0 \le i \le 2$; and $h+i=2$.]

Specific examples of the alkoxysilane (iii) include methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyoxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, dibutylethoxypropoxysilane, phenyldimethoxysilane, phenylmethoxyethoxysilane, phenyldiethoxysilane, phenylmethoxypropoxysilane, phenylmethoxypentyloxysilane, and phenylmethoxyphenyoxysilane. Among them, methyldimethoxysilane and methyldiethoxysilane are preferred.

The reaction product (C1) in the alkoxysilane compound (C) can be prepared by a method of hydrolyzing one or more alkoxysilanes selected from the above alkoxysilanes (i) to (iii) in the presence of an acid catalyst, water, and an organic solvent.

As described above, water is used for hydrolysis reaction of alkoxysilane. In the P-type diffusing agent composition according to the present embodiment, the content of water based on the whole composition is preferably 1% by mass or less, more preferably 0.5% by mass or less. Still more preferably, water is not substantially contained. The above conditions allow the preservation stability of the P-type diffusing agent composition to be further improved.

The acid catalyst that can be used may be an organic acid or an inorganic acid. Examples of the inorganic acid that can be used include sulfuric acid, phosphoric acid, nitric acid, and hydrochloric acid. Among them, phosphoric acid and nitric acid are preferred. Examples of the organic acid include carboxylic acids such as formic acid, oxalic acid, fumaric acid, maleic acid, glacial acetic acid, acetic acid anhydride, propionic acid, and n-butyric acid; and organic acids having a sulfur-containing acid residue. An example of the organic acids having a sulfur-containing acid residue includes an organic sulfonic acid, and examples of the esterificated compounds thereof include an organic sulfate ester and an organic sulfite ester. Among them, particularly an organic sulfonic acid (for example, a compound represented by Formula (7) below) is preferred.

$$R^{13}-X \quad (7)$$

[where $R^{13}$ represents a hydrocarbon group which may have a substituent and X represents a sulfonic group.]

In Formula (7) above, the hydrocarbon group as $R^{13}$ is preferably a hydrocarbon group having 1 to 20 carbon atoms. This hydrocarbon group may be a saturated or unsaturated group, and may be any one of linear, branched and cyclic groups. When the hydrocarbon group of $R^{13}$ is circular, aromatic hydrocarbon groups such as a phenyl group, a naphthyl group, and an anthryl group are preferred. Among them, a phenyl group is particularly preferred. One or more hydrocarbon groups having 1 to 20 carbon atoms may be bonded to the aromatic ring in the aromatic hydrocarbon group as a substituent. The hydrocarbon group represented as the substituent on the aromatic ring may be a saturated or unsaturated group, and may be any one of linear, branched and cyclic groups. The hydrocarbon group represented as $R^{13}$ may have one or more substituents. Examples of the substituent include a halogen atom such as a fluorine atom, and a sulfonic acid group, a carboxyl group, a hydroxyl group, an amino group, a cyano group.

The acid catalyst acts as a catalyst when the alkoxysilane is hydrolyzed in the presence of water. The amount of the acid catalyst that is used is preferably prepared such that the concentration thereof in the hydrolysis reaction system is in a range of 1 to 1000 ppm, particularly in a range of 5 to 800 ppm. The hydrolysis rate of a siloxane polymer changes in accordance with an addition amount of water. Thus, the addition amount of water is determined in accordance with the hydrolysis rate to be obtained.

Examples of the organic solvent in the hydrolysis reaction system include monohydric alcohol such as methanol, ethanol, propanol, isopropanol (IPA), and n-butanol; alkyl carboxylic esters such as methyl-3-methoxypropionate, and ethyl-3-ethoxypropionate; polyhydric alcohol such as ethylene glycol, diethylene glycol, propylene glycol, glycerin, trimethylolpropane, and hexanetriol; monoethers or monoacetates of a polyhydric alcohol, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether, and propylene glycol monobutyl ether; esters such as methyl acetate, ethyl acetate, and butyl acetate; ketones such as acetone, methyl ethyl ketone, and methyl isoamyl ketone; and polyhydric alcohol ethers in which all hydroxyl groups in polyhydric alcohol are alkyl-etherized, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methyl ethyl ether. These organic solvents may be used alone or in combination of two or more of them.

In such a reaction system, the alkoxysilane is hydrolyzed to yield an alkoxy silane compound (C). The hydrolysis reaction is usually completed in a period of about 1 to 100 hours. In order to shorten the reaction period, it is preferred to heat the system in a temperature range of 80° C. or less.

After the completion of the reaction, a reaction solution is yielded that contains the synthesized alkoxy silane compound (C) and the organic solvent used for the reaction. The alkoxy silane compound (C) can be obtained in a dry state separated from the organic solvent by a conventionally-known method or a solution state in which the solvent is substituted, if necessary using the above method.

As the alkoxy silane compound (C), a siloxane polymer (C2) represented by Formula (8) below may be used in place of or together with the reaction product (C1).

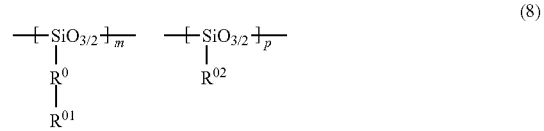

$$(8)$$

In Formula (8), $R^{01}$ represents a group containing an ethylenically unsaturated double bond, $R^0$ represents an alkylene group having 1 to 9 carbon atoms, different $R^0$s may be included, $R^{02}$ represents an alkyl group, an alkoxy group, an aryl group or a hydrogen atom, different $R^{02}$s may be included, and the ratio of m:p is from 1:99 to 100:0, preferably from 10:90 to 90:10. The ratio of m:p can be appropriately set taking into consideration the Si content and the adjustment of the film thickness.

As the group containing an ethylenically unsaturated double bond in $R^{01}$ in Formula (8), a group having an ethylenically unsaturated double bond at the end is preferred. Particularly, an acryloyloxy group or a methacryloyloxy group is preferred.

Examples of the alkylene group having 1 to 9 carbon atoms in $R^0$ in Formula (8) include linear or branched alkylene groups. A linear alkylene group having 1 to 7 carbon atoms is preferred, a linear alkylene group having 1 to 5 carbon atoms is more preferred, and a methylene group, an ethylene group, and an n-propylene group are particularly preferred.

Examples of the alkyl group in $R^{02}$ in Formula (8) include alkyl groups having 1 to 10 carbon atoms. Examples thereof include linear alkyl groups such as methyl, ethyl, propyl, butyl, pentyl, hexyl, heptyl, octyl, nonyl, and decyl; branched alkyl groups such as 1-methylethyl, 1-methylpropyl, 2-methylpropyl, 1-methylbutyl, 2-methylbutyl, 3-methylbutyl, 1-ethylbutyl, 2-ethylbutyl, 1-methylpentyl, 2-methylpentyl, 3-methylpentyl, and 4-methylpentyl; cyclic alkyl groups such as cyclopentyl, cyclohexyl group, adamantyl, norbornyl, isobornyl, and tricyclodecanyl. An alkyl group having 1 to 5 carbon atoms is preferred, an alkyl group having 1 to 3 carbon atoms is more preferred, and a methyl group is particularly preferred.

Examples of the alkoxy group in $R^{02}$ in Formula (8) include alkoxy groups having 1 to 5 carbon atoms. Examples thereof include a methoxy group, an ethoxy group, a propoxy group, a butoxy group, and a pentyloxy group. An alkoxy group having 1 to 3 carbon atoms is preferred, and a methoxy group or an ethoxy group is more preferred.

Examples of the aryl group in $R^{02}$ in Formula (8) include a phenyl group, a biphenyl group, a fluorenyl group, a naphthyl group, an anthryl group, and a phenantolyl group. A phenyl group is preferred. The aryl group of $R^{02}$ may have a substituent such as an alkyl group.

Particularly preferable examples of the siloxane polymer (C2) represented by Formula (8) include a siloxane polymer (C2-1) represented by Formula (9) below, a siloxane polymer (C2-2) represented by Formula (10) below, and a siloxane polymer (C2-3) represented by Formula (11) below. In Formula (8), m and p are the same. S+t equals p and u+v equals p. The mass average molecular weight (Mw) of the alkoxy silane compound (C) is not particularly limited and it is preferably from 500 to 30000, more preferably from 1000 to 10000.

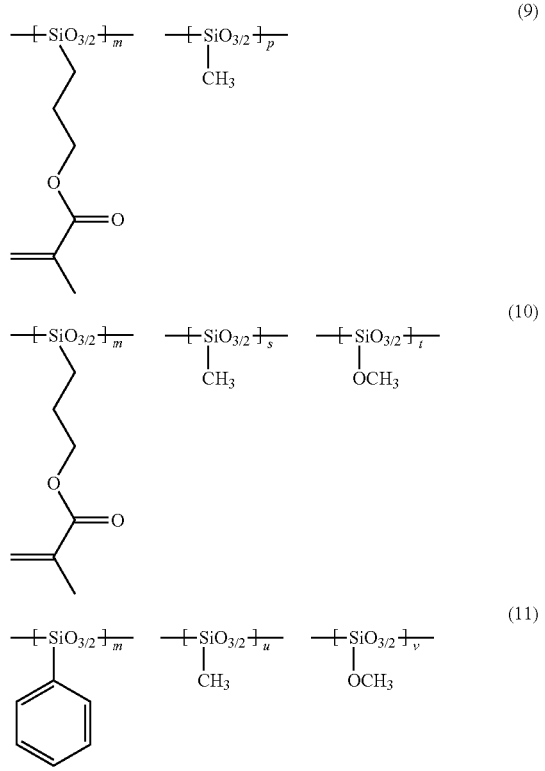

The content of the alkoxy silane compound (C) is preferably from 1 to 50% by mass, more preferably from 1.5 to 35% by mass, still more preferably from 2 to 20% by mass based on the whole composition ($SiO_2$ equivalent-content). When the content of the alkoxy silane compound (C) is 1% by mass or more, the diffusion selectivity of the diffusing agent composition becomes excellent. When the above content is 50% by mass or less, it is possible to allow the content balance among components contained in the diffusing agent composition to be excellent.

<Organic Solvent (D)>

The P-type diffusing agent composition contains an organic solvent (D) as an optional component. The organic solvent (D) is one other than the polyhydric alcohol (B). Examples of the organic solvent (D) include alcohols such as methanol, ethanol, isopropanol, and butanol; ketones such as acetone, diethyl ketone, and methyl ethyl ketone; esters such as methyl acetate, ethyl acetate, and butyl acetate; polyhydric alcohol such as propylene glycol, glycerin, and dipropylene glycol; ethers such as dipropylene glycol dimethyl ether, ethyleneglycol dimethyl ether, ethylene glycol diethyl ether, propylene glycol dimethyl ether, and propylene glycol diethyl ether; monoether glycols such as ethylene glycol monomethyl ether, ethylene glycol monoethyl ether, propylene glycol monomethyl ether, propylene glycol monoethyl ether, and dipropylene glycol monomethyl ether; cyclic ethers such as tetrahydrofuran and dioxane; and ether esters such as propylene glycol monomethyl ether acetate and propylene glycol monoethyl ether acetate.

The P-type diffusing agent composition may contain a usual surfactant or defoamant as another component. For example, coating property, planarization property, and development property can be improved by containing the surfactant. Thus, it is possible to reduce the occurrence of uneven coating in the diffusing agent composition layer formed after the coating. As such a surfactant, a conventionally known one can be used, and a silicone-based surfactant is preferred. Further, it is preferable that the surfactant is contained in an amount within a range of 500 to 3000 ppm by mass, particularly 600 to 2500 ppm by mass, based on the whole diffusing agent composition. It is further preferable that the surfactant is contained in an amount of 2000 ppm by mass or less, because the detachability of the diffusing agent composition layer after a diffusion treatment is excellent. The surfactant may be used alone or in combination. When the pattern of the P-type diffusing agent composition is formed by the screen printing method in the diffusing agent layer formation process below, the P-type diffusing agent composition may contain the fine particles (E) in order to improve the printing performance and the accuracy of the printing pattern. As the fine particles (E), conventionally known particles may be appropriately used taking into consideration viscosity and thixotropy. Examples of the fine particles (E) include silica particles and alumina particles.

It is preferable that the concentration of the metal impurities contained in the P-type diffusing agent composition (other than the metal components contained in the borate ester, the polyhydric alcohol (B), and the alkoxy silane compound (C)) is 500 ppb (parts per billion) or less. This can suppress a decrease in the efficiency of the photovoltaic effect which is caused when metal impurities are contained.

<Preparation of N-type Diffusing Agent Composition>

The N-type diffusing agent composition contains an N-type (second conductivity type) impurity-diffusing component (A2) and the alkoxy silane compound (C). The N-type diffusing agent composition contains the organic solvent (D) as an optional component. Hereinafter, the components of the N-type diffusing agent composition will be described in detail.

<N-type Impurity-diffusing Component (A2)>

The N-type impurity-diffusing component (A2) contains a compound of an element of Group V (Group 15) which is generally used as a dopant for manufacturing a solar cell. In the case of the N-type impurity-diffusing component (A2), an N-type impurity diffusion layer (impurity diffusion region) can be formed in a P-type semiconductor substrate, and an $N^+$ type (high concentration N type) impurity diffusion layer can be formed in an N-type semiconductor substrate. Examples of the compound of an element of Group V include $P_2O_5$, $Bi_2O_3$, Sb $(OCH_2CH_3)_3$, $SbCl_3$, As $(OC_4H_9)_3$; and phosphate esters such as monomethyl phosphate, dimethyl phosphate, monoethyl phosphate, diethyl phosphate, triethyl phosphate, monopropyl phosphate, dipropyl phosphate, monobutyl phosphate, dibutyl phosphate, and tributyl phosphate. At least one kind of these compounds is contained in the N-type impurity-diffusing component (A2). In the present embodiment, the N-type impurity-diffusing component (A2) is a compound containing phosphorus. The content of the N-type impurity-diffusing component (A2) in the N-type diffusing agent composition is appropriately adjusted depending on the thickness of the impurity diffusion layer to be formed on the semiconductor substrate. For example, the content of the N-type impurity-diffusing component (A2) is preferably 5 to 60% by mass, more preferably 10 to 40% by mass, still more preferably 15 to 30% by mass based on the total mass of the N-type diffusing agent composition.

The alkoxy silane compound (C) and the organic solvent (D) are the same as those contained in the above P-type diffusing agent composition. Similarly to the P-type diffusing agent composition, the N-type diffusing agent composition may contain a usual surfactant or defoamant as another component. The composition of each of the conductivity-type diffusing agent compositions is not limited to the above ones. For example, the P-type impurity-diffusing component (A1) contained in the P-type diffusing agent composition may be a compound of an element of Group III (Group 13) other than the borate ester. The compound is generally used as a dopant for manufacturing a solar cell. Examples of the compound of an element of Group III include $B_2O_3$, $Al_2O_3$, and gallium trichloride. The P-type impurity-diffusing component (A1) may contain at least one kind of these compounds of the element of Group III. Further, the composition does not necessarily contain the polyhydric alcohol (B). When the pattern of the N-type diffusing agent composition is formed by the screen printing method, the N-type diffusing agent composition may contain the fine particles (E).

The P-type diffusing agent composition and the N-type diffusing agent composition can be prepared by mixing the above components in arbitrary order by a conventionally-known method in such a manner a homogeneous solution is prepared. According to the selective coating method used in the following process of forming the diffusing agent layer, the viscosity of the diffusing agent composition can be adjusted.

<Formation of P-type Diffusing Agent Layer>

As shown in FIG. 1A, for example, a P-type silicon wafer 1 is prepared as a semiconductor substrate 1. The semiconductor substrate 1 is a substrate for solar cells having a texture portion 1a on one of the surfaces. A texture portion may be or not be formed on the other surface of the semiconductor substrate 1. The texture portion 1a has a structure including successively arranged convexo-concave portions. This structure includes a structure including regularly arranged convexo-concaves with the same pitch and height and a structure including randomly arranged convexo-concave portions with various pitches and heights. The pitch of the convexo-concave portions (the distance in the plane direction between the top of the convex portion and the deepest part of the concave portion) is, for example, from 1 to 10 micrometer. The height of the convexo-concave portions (the height from the deepest part of the concave portion to the top of the convex portion) is, for example, from 1 to 10 micrometer. The texture portion 1a prevents reflection of light on the surface of the semiconductor substrate 1. The texture structure can be formed using a well-known wet etching method or the like.

The P-type diffusing agent composition containing the P-type impurity-diffusing component (A1) is selectively applied onto the surface of the semiconductor substrate 1 (surface opposite to the surface on which the texture portion 1a has been formed) to form P-type diffusing agent layers 2 (first diffusing agent layer). The process of selectively applying the P-type diffusing agent composition to the semiconductor substrate 1 is performed by, for example, an ink-jet printing method, a screen printing method, a spray coating method, a roll coat printing method, a letterpress printing method, an intaglio printing method, an offset printing method or the like. After forming the P-type diffusing agent layers 2 in a predetermined pattern, the semiconductor substrate 1 is mounted on a hot plate, followed by a baking treatment, for example, at 200° C. for 0.5 minute to dry the P-type diffusing agent layers 2.

<Calcination of P-type Diffusing Agent Layers>

Figure 1B:
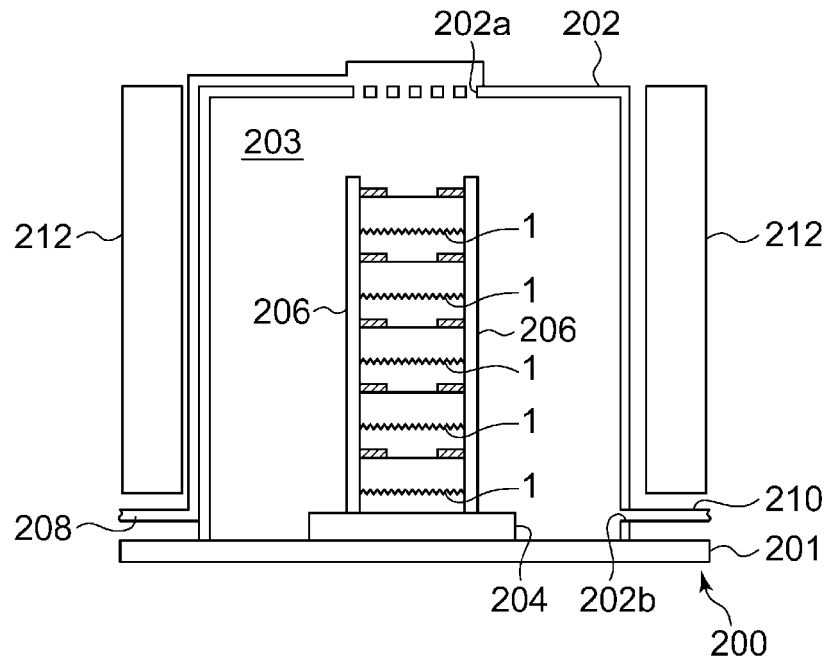

Next, as shown in FIG. 1B, the semiconductor substrate 1 having the P-type diffusing agent layers 2 formed thereon is inserted into a heating furnace 200. The heating furnace 200 is, for example, a conventionally-known vertical diffusion furnace and includes a base portion 201, an outer tube 202, a mounting stand 204, a support member 206, a gas supply passage 208, a gas exhaust passage 210, and a heater 212.

The outer tube 202 is attached to the base portion 201 so that the axial direction is parallel to the perpendicular direction. The furnace 203 is formed with the base portion 201 and the outer tube 202. The mounting stand 204 is circular in a planar view and is located in the center of the furnace 203. The support member 206 has a column shape. At the outer edge portion of the mounting stand 204, a plurality of the members are formed at spaces in the circumferential direction. A plurality of grooves are formed in the surfaces of the support members 206 at spaces in the axial direction. The semiconductor substrate 1 is supported by the support members 206 in such a manner that the outer edge portions are engaged with the grooves of the support members 206. The gas supply passage 208 is a duct which supplies an atmosphere gas to the furnace 203. One end of the passage is connected to an atmosphere gas tank (not shown), and the other end is connected to an opening 202a of the outer tube 202. The gas exhaust passage 210 is a duct which discharges the gas in the furnace 203. One end of the passage is connected to an opening 202b of the outer tube 202. The heater 212 is formed at the outer periphery of the outer tube 202 and heats the inside of the furnace 203.

A plurality of the semiconductor substrates 1 are located in the furnace 203. As the atmospheric gas, for example, a nitrogen ($N_2$) gas is supplied from the gas supply passage 208 to the furnace 203. The semiconductor substrates 1 are heated in an $N_2$ gas atmosphere to calcine the P-type diffusing agent layers 2. As the atmosphere gas, oxygen gas, a mixed gas of nitrogen and oxygen, and the like can be used, in addition to the $N_2$ gas. The P-type diffusing agent layers 2 are thermally densified by the calcination process. The heating temperature of the P-type diffusing agent layers 2 in calcination, or the calcination temperature is preferably from 500° C. to 900° C. When the calcination temperature is set to 500° C. or more, the P-type diffusing agent layers 2 can be surely calcinated.

When the calcination temperature is set to 900° C. or less, it is possible to surely prevent the P-type impurity-diffusing component (A1) from diffusing from the P-type diffusing agent layers 2 to the outside. The calcination time is preferably from 10 to 60 minutes.

<Formation of N-type Diffusing Agent Layer>

Figure 1C:
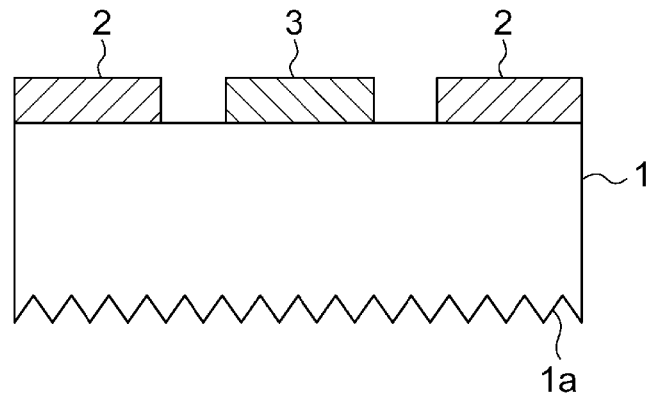

Next, as shown in FIG. 1C, the semiconductor substrate 1 is taken out from the heating furnace 200 and cooled. Then, the N-type diffusing agent composition containing the N-type impurity-diffusing component (A2) is selectively applied onto the surface of the semiconductor substrate 1 excluding the region where the P-type diffusing agent layers 2 have been formed, to form an N-type diffusing agent layer 3 (second diffusing agent layer). The process of electively applying the N-type diffusing agent composition to the semiconductor substrate 1 is performed by, for example, an ink-jet printing method, a screen printing method, a spray coating method, a roll coat printing method, a letterpress printing method, an intaglio printing method, an offset printing method or the like. After forming the N-type diffusing agent layer 3 in a predetermined pattern, the semiconductor substrate 1 is mounted on a hot plate, followed by a baking treatment at 200° C. for 0.5 minute to dry the N-type diffusing agent layer 3. In the present embodiment, the P-type diffusing agent layers 2 and the N-type diffusing agent layer 3 are formed on the same surface of the semiconductor substrate 1.

<Simultaneous Diffusion of P-Type Impurity-Diffusing Component (A1) and N-Type Impurity-Diffusing Component (A2)>

Figure 2A:
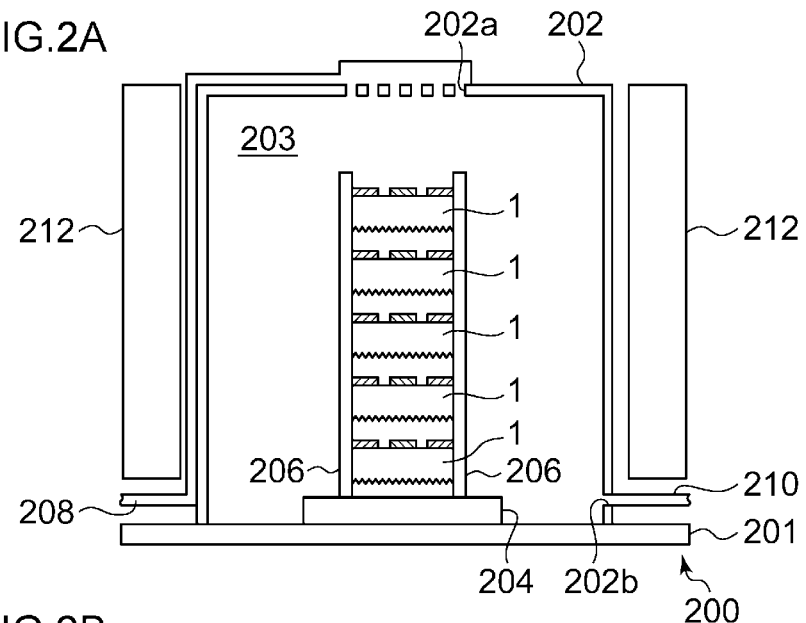
FIGS. 2A to 2D are flow charts of the method of diffusing an impurity-diffusing component and the method of manufacturing a solar cell according to an embodiment.

Next, as shown in FIG. 2A, the semiconductor substrate 1 having the P-type diffusing agent layers 2 and the N-type diffusing agent layer 3 formed thereon is inserted into the heating furnace 200. A plurality of the semiconductor substrates 1 are located in the furnace 203. As the atmospheric gas, for example, a nitrogen ($N_2$) gas is supplied from the gas supply passage 208 to the furnace 203. Then, the semiconductor substrate 1 is heated at a temperature higher than the calcination temperature in an $N_2$ gas atmosphere to diffuse the P-type impurity-diffusing component (A1) and the N-type impurity-diffusing component (A2) into the semiconductor substrate 1. The heating temperature of the semiconductor substrate 1 (i.e., thermal-diffusion temperature) is preferably from 950° C. to 1100° C. When the thermal-diffusion temperature is set to 950° C. or more, the thermal diffusion of the impurity-diffusing component can be surely completed. When the thermal-diffusion temperature is set to 1100° C. or less, it is possible to surely prevent the impurity-diffusing component from diffusing beyond a desired diffusion region into the semiconductor substrate 1 and to prevent the semiconductor substrate 1 from being damaged by heat. The diffusion time is preferably from 10 to 60 minutes. In this regard, the semiconductor substrate 1 may be heated using a conventional laser irradiation method in place of the diffusion furnace.

Figure 2B:
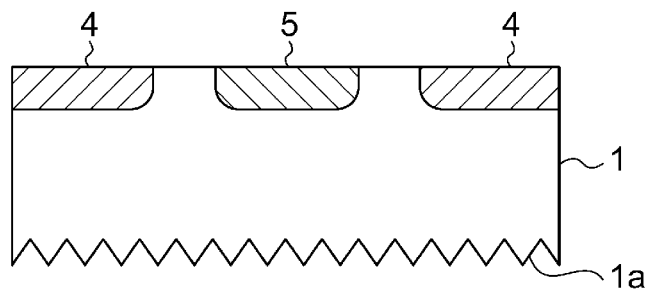

Thereafter, the semiconductor substrate 1 taken out from the heating furnace 200 is immersed in a release liquid (e.g., fluoric acid) to remove the P-type diffusing agent layers 2 and the N-type diffusing agent layer 3. As shown in FIG. 2B, the semiconductor substrate 1 having P-type impurity diffusion layers (first impurity diffusion layers) and an N-type impurity diffusion layer 5 (second impurity diffusion layer) formed thereon can be produced by the above processes.

<Formation of Solar Cell>

Figure 2C:
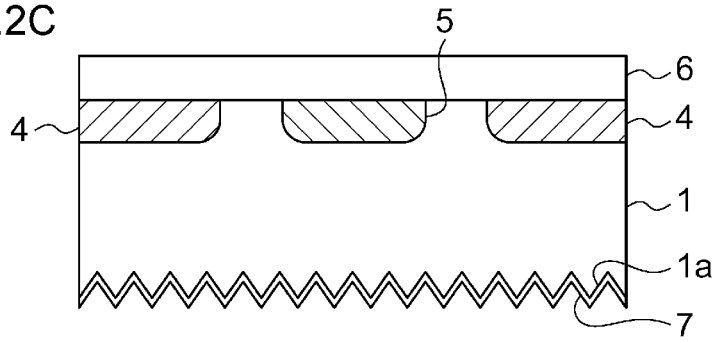

Next, as shown in FIG. 2C, a passivation layer 6 composed of a silicon nitride film (SiN film) is formed on the side of the surface of the semiconductor substrate 1 on which the P-type impurity diffusion layers 4 and the N-type impurity diffusion layer 5 are formed using a well-known chemical vapor deposition (CVD method), for example, a plasma CVD method. The passivation layer also functions as an antireflective film. Further, an antireflective film 7 composed of a silicon nitride film is formed on the surface of the texture portion 1a.

Figure 2D:
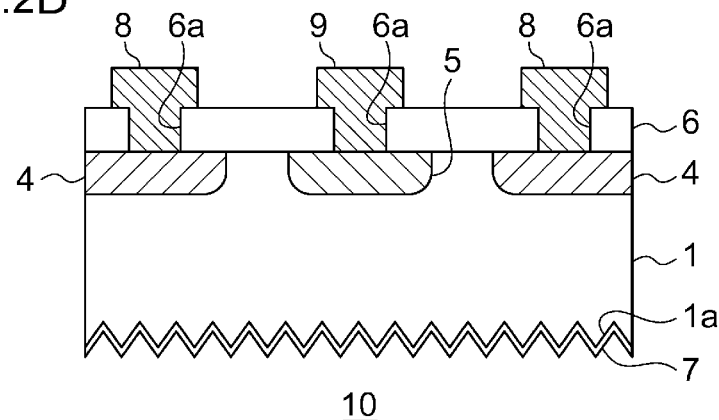

Next, as shown in FIG. 2D, the passivation layer 6 is selectively removed by a well-known photolithography method and an etching method. Contact holes 6a are formed so that predetermined regions of the P-type impurity diffusion layers 4 and the N-type impurity diffusion layer 5 are exposed. The contact holes 6a formed on the P-type impurity diffusion layer 4 are filled with metal by, for example, an electrolytic plating method, an electroless plating method or a screen printing method using a metal paste to form an electrode 8 (a first electrode) electrically connected to the P-type impurity diffusion layer 4. Similarly, an electrode 9 (a second electrode) electrically connected to the N-type impurity diffusion layer 5 is formed on the contact holes 6a formed on the N-type impurity diffusion layer 5. A solar cell 10 according to the present embodiment can be produced by the above process. The method of diffusing an impurity-diffusing component according to the present embodiment can be employed in forming a semiconductor substrate to be used for applications other than the solar cell.

As described above, in the method of diffusing an impurity-diffusing component according to the present embodiment, the P-type diffusing agent layer 2 is formed on the surface of the semiconductor substrate 1 and calcined, followed by formation of the N-type diffusing agent layer 3 and simultaneous diffusion of boron and phosphorus is performed. When the P-type diffusing agent layer 2 is not thermally densified, the P-type impurity-diffusing component (A1) is diffused from the P-type diffusing agent layer 2 to the outside by heating in the simultaneous diffusion process, the impurity-diffusing component (A1) is absorbed into the N-type diffusing agent layer 3, and thus the impurity-diffusing component (A1) may be diffused in the region of the semiconductor substrate 1 where the N-type impurity-diffusing component (A2) should be diffused. Further, the impurity-diffusing component (A2) which has been diffused from the N-type diffusing agent layer 3 to the outside by heating in the simultaneous diffusion process is absorbed into the P-type diffusing agent layer 2, and thus the impurity-diffusing component (A2) may be diffused in the region of the semiconductor substrate 1 where the impurity-diffusing component (A1) should be diffused. On the other hand, in the present embodiment, the P-type diffusing agent layer 2 is thermally densified before the simultaneous diffusion process. Accordingly, it is possible to prevent the P-type impurity-diffusing component from diffusing from the P-type diffusing agent layer 2 to the outside. Further, it is possible to prevent the impurity-diffusing component (A2) diffused from the N-type diffusing agent layer 3 to the outside from being absorbed into the P-type diffusing agent layer 2.

That is, according to the present embodiment, when one diffusing agent layer containing a dopant is previously calcined to fuse, it is possible to suppress the diffusion of an element serving as a counter (counter doping) in the subsequent simultaneous diffusion process. Therefore, according to the present embodiment, it is possible to suppress the out diffusion. As a result, different conductivity-type impurity-diffusing components can be selectively and simultaneously diffused into the semiconductor substrate 1 with higher accuracy. The method of diffusing an impurity-diffusing component is used to manufacture a solar cell, so that it is possible to intend to improve the efficiency of the solar cell.

In the present embodiment, one diffusing agent layer is calcined before the formation of the other diffusing agent layer. When the two diffusing agent layers are formed and both of the layers are subjected to a calcination treatment before the simultaneous diffusion process, phenomena such as contamination to be caused when simultaneous diffusion is performed without the calcination process may be happen. Hence, the impurity-diffusing components (A1) and (A2) are diffused from the P-type diffusing agent layers and the N-type diffusing agent layer to the outside by heating in the calcination process. The diffusion amount is smaller than that in the case of simultaneous diffusion. Then, the impurity-diffusing component (A1) is absorbed into the N-type diffusing agent layer, while the impurity-diffusing component (A2) is absorbed into the P-type diffusing agent layers. On the other hand, in the present embodiment, since one diffusing agent layer precoated is calcined, and then the other diffusing agent layer is formed, it is possible to suppress the contamination.

In the present embodiment, the out diffusion is suppressed by calcining the diffusing agent layer. Thus, it is possible to suppress the out diffusion without preventing a high throughput of manufacture of semiconductors as compared with the method of covering the semiconductor substrate 1 with a mask for preventing out diffusion. The calcination of the diffusing agent layer is performed at a temperature lower than the heating temperature when the impurity-diffusing component is thermally diffused. Therefore, the time required for the calcination process is shorter than the time required for the diffusion process. Therefore, it is possible to reduce the manufacturing time by performing the simultaneous diffusion after the calcination, as compared with the case where the thermal diffusion of the P-type impurity-diffusing component (A1) and the thermal diffusion of the N-type impurity-diffusing component (A2) are performed separately. Thus, it is possible to intend to improve the manufacturing throughput. In the present embodiment, the diffusing agent composition is applied to the semiconductor substrate 1 by printing. Thus, the amount of the composition to be used can be reduced as compared with the case where the conventional spin coating method is used. Consequently, it is possible to intend to reduce the manufacturing process cost.

In the present embodiment, the P-type diffusing agent layer 2 to be subjected to the calcination treatment contains the alkoxy silane compound (C). Therefore, the P-type diffusing agent layer 2 can be surely fused by the calcination treatment. In the present embodiment, the P-type diffusing agent layer 2 containing boron is calcined, followed by formation of the N-type diffusing agent layer 3 containing phosphorus (i.e., the first conductivity type is boron and the second conductivity type is phosphorus). Since phosphorus is easily volatilized as compared with boron, it is easily diffused to the outside. Thus, when the P-type diffusing agent layer 2 containing boron is subjected to the calcination treatment, the amount of the impurity-diffusing component being diffused to the outside in the calcination process can be reduced as compared with the case where the N-type diffusing agent layer 3 containing phosphorus is subjected to the calcination treatment.

Hence, it is preferable to determine which of the P-type diffusing agent layer 2 and the N-type diffusing agent layer 3 is subjected to the calcination treatment, in other words, which of the two layers should be previously formed on semiconductor substrate 1, in accordance with the easiness of the diffusion of the impurity-diffusing components contained therein. Hence, it is preferable to previously form a diffusing agent layer containing an impurity-diffusing component which is relatively hard to diffuse. For example, when boron is compared with phosphorus as described above, boron is hardly diffused. Thus, it is preferable to previously form the P-type diffusing agent layer 2 containing boron. Further, when boron is compared with antimony, antimony is hardly diffused. Thus, it is preferable to previously form the N-type diffusing agent layer 3 containing antimony. Even when the N-type diffusing agent layer 3 containing phosphorus is calcined, followed by formation of the P-type diffusing agent layer 2 containing boron (i.e., the first conductivity type is phosphorus and the second conductivity type is boron), it is possible to suppress the out diffusion as compared with the conventional simultaneous diffusion method without passing through the calcination process.

The present invention is not limited to the above embodiments, and various modifications, such as a design change, may be added thereto on the basis of knowledge of those skilled in the art. It should be understood that any embodiment to which the modifications are added is also included in the scope of the present invention. New embodiments resulting from combinations of the above embodiments and the following exemplary variations will provide the advantages of the embodiment and variations combined.

In the above embodiment, the impurity diffusion layer is formed on the P-type silicon wafer; however the impurity diffusion layer may be formed on an N-type silicon wafer. In the above embodiment, the heating furnace 200 is the vertical diffusion furnace; however it may be a conventionally-known horizontal diffusion furnace.

EXAMPLES

Hereinafter, examples of the present invention will be described, however those examples are only exemplifications for suitably illustrating the invention and do not limit the invention.

<Preparation of Diffusion-agent Composition>

According to the composition of each component and the content shown in Table 1, each component was uniformly mixed, and the resultant mixture was filtered through a 0.45-micrometer membrane filter to prepare P-type diffusing agent compositions I to III and an N-type diffusing agent composition. Triethyl borate (TEB) was used as a P-type impurity-diffusing component (A1) and dibutyl phosphate was used as an N-type impurity-diffusing component (A2). In each diffusing agent composition, a silicone-based surfactant (SF8421EG: manufactured by Toray Dow Corning Inc.) was used as a surfactant. As the organic solvent (D), dipropylene glycol monomethyl ether (MFDG) is used. The content of the solvent is the balance obtained by subtracting each component from 100 wt % when the total mass of the diffusing agent composition is 100 wt %.

TABLE 1

| | ALKOXY SILANE COMPOUND (C1) | | ALKOXY SILANE COMPOUND (C2) | | P-TYPE IMPURITY-DIFFUSING COMPONENT (A1) | |
|---|---|---|---|---|---|---|
| | STRUCTURE | SiO₂ EQUIVALENT-CONTENT (wt %) | STRUCTURE | SiO₂ EQUIVALENT-CONTENT (wt %) | COMPONENT | CONTENT (wt %) |
| P-TYPE DIFFUSING AGENT COMPOSITION I | C-1 | 6.37 | C-2 | 3.95 | TEB | 3.99 |
| P-TYPE DIFFUSING AGENT COMPOSITION II | C-1 | 6.37 | C-2 | 3.95 | TEB | 4.66 |
| P-TYPE DIFFUSING AGENT COMPOSITION III | C-1 | 3.19 | C-2 | 1.98 | TEB | 2.33 |
| N-TYPE DIFFUSING AGENT COMPOSITION | C-1 | 8.3 | C-2 | 7.9 | — | — |

| | POLYHYDRIC ALCOHOL (B) | | N-TYPE IMPURITY-DIFFUSING COMPONENT (A2) | | MOLAR RATIO OF BORATE ESTER AND POLYHYDRIC ALCOHOL | SURFACTANT (ppm) | ORGANIC SOLVENT (D) |
|---|---|---|---|---|---|---|---|
| | COMPONENT | CONTENT (wt %) | COMPONENT | CONTENT (wt %) | | | |
| P-TYPE DIFFUSING AGENT COMPOSITION I | MANNITOL | 8.97 | — | — | 2:1 | 500 | MFDG |
| P-TYPE DIFFUSING AGENT COMPOSITION II | MANNITOL | 10.47 | — | — | 2:1 | 500 | MFDG |
| P-TYPE DIFFUSING AGENT COMPOSITION III | MANNITOL | 5.24 | — | — | 2:1 | 500 | MFDG |
| N-TYPE DIFFUSING AGENT COMPOSITION | — | — | DIBUTYL PHOSPHATE | 22.7 | — | 1500 | MFDG |

In Table 1, the abbreviations indicate the following compounds:

TEB: triethyl borate; and
MFDG: dipropylene glycol monomethyl ether

Structure C-1 in Table 1 is a condensation product prepared by using tetraethoxy silane ($Si(OC_2H_5)_4$) as a starting material. Structure C-2 is a condensation product represented by Formula (12) below.

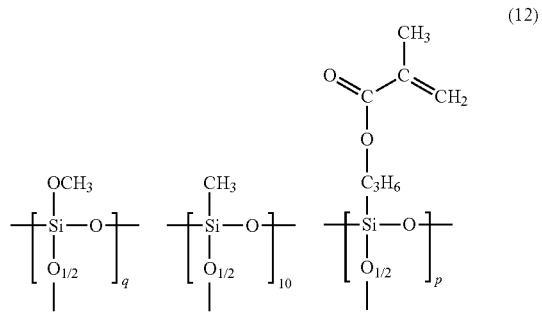

[In Formula (12), the ratio of p:q is from 40:20 to 50:10.]

Example 1

The P-type diffusing agent composition I was selectively applied to a predetermined region of a 6-inch P-type mirror silicon wafer (CZ-P<100>/5 to 15 Ω·cm) by the ink jet printing method using an inkjet applicator (MID-500C: manufactured by Musashi Engineering, Inc.) to form a P-type diffusing agent pattern. Then, P-type diffusing agent patterns were placed on a hot plate, followed by a baking treatment at 200° C. for 0.5 minute. The thickness of the P-type diffusing agent pattern after the baking treatment was 1.2 micrometer. The silicon wafer having P-type diffusing agent patterns formed thereon was located in a heating furnace, and heated at 650° C. for 30 minutes to calcine it. Thereafter, the N-type diffusing agent composition was selectively applied to the predetermined region of the silicon wafer by the inkjet printing method to form an N-type diffusing agent pattern. Then, N-type diffusing agent patterns were placed on a hot plate, followed by a baking treatment at 200° C. for 0.5 minute. The thickness of the N-type diffusing agent pattern after the baking treatment was 1 micrometer.

Figure 3A:
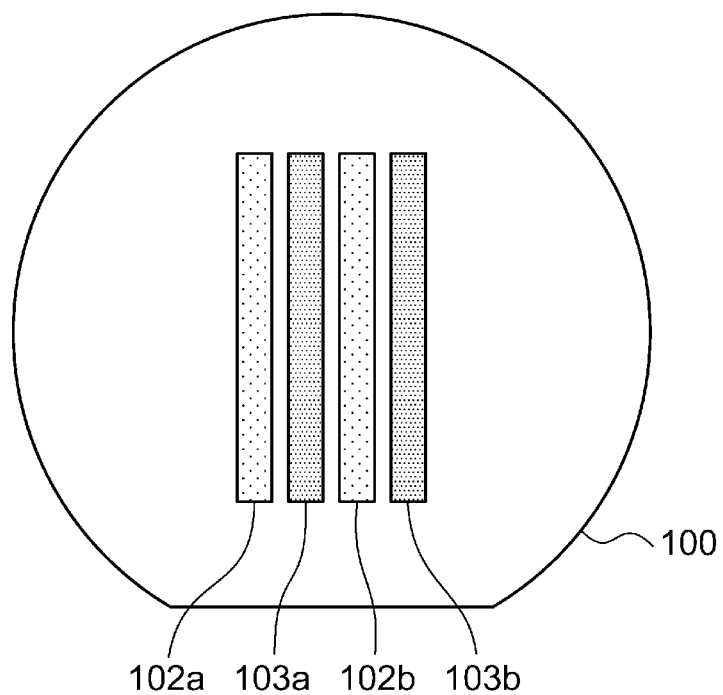
FIG. 3A is a plan view schematically showing P-type diffusing agent patterns and N-type diffusing agent patterns that are formed on a wafer.

FIG. 3A is a plan view schematically showing P-type diffusing agent patterns and N-type diffusing agent patterns that are formed on a wafer. As shown in FIG. 3A, two belt-like P-type diffusing agent patterns 102a and 102b and two belt-like N-type diffusing agent patterns 103a and 103b were formed on a wafer 100. The P-type diffusing agent patterns 102a and 102b and the N-type diffusing agent patterns 103a and 103b were alternately arranged so that their long sides were parallel to one another. Hence, the P-type diffusing agent pattern 102a, the N-type diffusing agent pattern 103a, the P-type diffusing agent pattern 102b, and the N-type diffusing agent pattern 103b were arranged in this order. The length of the long side of each belt-like pattern is 100 mm, the length of the short side is 8 mm, and the interval between adjacent belt-like patterns is 2 mm.

Figure 3B:
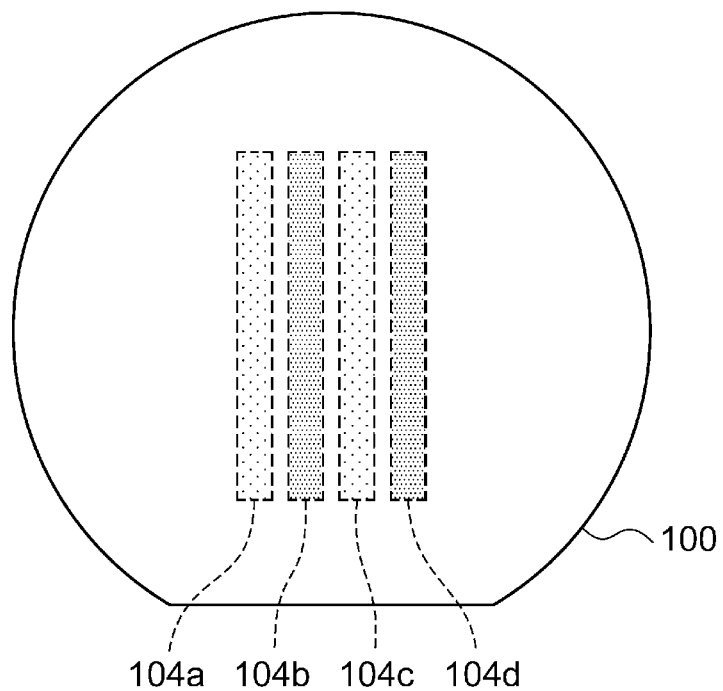
FIG. 3B is a plan view schematically showing a wafer in a state where the P-type diffusing agent patterns and the N-type diffusing agent patterns are removed.

The silicon wafer having the N-type diffusing agent pattern and the calcined P-type diffusing agent pattern formed thereon was located in a heating furnace, and heated at 980° C. for 20 minutes. Boron in the P-type diffusing agent pattern and phosphorus in the N-type diffusing agent pattern were thermally diffused at the same time to form a P-type impurity diffusion layer and an N-type impurity diffusion layer in the silicon wafer. Thereafter, each of the diffusing agent patterns was removed by immersion in a 5% fluoric acid solution for 10 minutes. A wafer of Example 1 was obtained in the above process. FIG. 3B is a plan view schematically showing a wafer in a state where the P-type diffusing agent patterns and the N-type diffusing agent patterns are removed. As shown in FIG. 3B, on the wafer 100 passed through the diffusion process, a belt-like impurity diffusion layer 104a was formed in the region where the P-type diffusing agent pattern 102a was formed. Similarly, a belt-like impurity diffused layer 104b, an impurity diffusion layer 104c, and an impurity diffusion layer 104d were respectively formed in the wafer region where the N-type diffusing agent pattern 103a was formed, the wafer region where the P-type diffusing agent pattern 102b was formed, and the wafer region where the N-type diffusing agent pattern 103b was formed.

Example 2

A wafer 100 of Example 2 was produced in the same manner as described in Example 1 except that the calcination temperature was set to 75° C. and the calcination time was set to 60 minutes.

Example 3

A wafer 100 of Example 3 was produced in the same manner as described in Example 1 except that the calcination temperature was set to 850° C.

Example 4

A wafer 100 of Example 4 was produced in the same manner as described in Example 1 except that the calcination temperature was set to 900° C.

Example 5

A wafer 100 of Example 5 was produced in the same manner as described in Example 1 except that the P-type diffusing agent composition II was used in place of the P-type diffusing agent composition I, the calcination temperature was set to 850° C., and the film thickness of the P-type diffusing agent patterns 102a and 102b after the baking treatment was 0.9 mm.

Example 6

A wafer 100 of Example 6 was produced in the same manner as described in Example 5 except that the film thickness of the P-type diffusing agent patterns 102a and 102b after the baking treatment was 0.5 mm.

Example 7

A wafer 100 of Example 7 was produced in the same manner as described in Example 1 except that the P-type diffusing agent composition III was used in place of the P-type diffusing agent composition I, the calcination temperature was set to 850° C., and the film thickness of the P-type diffusing agent patterns 102a and 102b after the baking treatment was 0.1 mm.

Example 8

A wafer 100 of Example 8 was produced in the same manner as described in Example 1 except that the N-type diffusing agent patterns 103a and 103b were formed before the formation of the P-type diffusing agent patterns 102a and 102b.

Example 9

A wafer 100 of Example 9 was produced in the same manner as described in Example 5 except that the film thickness of the P-type diffusing agent patterns 102a and 102b after the baking treatment was 1.2 mm.

Example 10

A wafer 100 of Example 10 was produced in the same manner as described in Example 1 except that the calcination temperature was set to 500° C.

Comparative Example 1

A wafer 100 of Comparative example 1 was produced in the same manner as described in Example 1 except that the N-type diffusing agent patterns 103a and 103b were formed before the formation of the P-type diffusing agent patterns 102a and 102b and the baking process was not performed.

Comparative Example 2

A wafer 100 of Comparative example 2 was produced in the same manner as described in Example 1 except that the calcination process was not performed.

The kind of the P-type diffusing agent composition, the pattern forming order, the pattern film thickness, and the calcination conditions used in the examples and comparative examples are as shown in Table 2.

TABLE 2

| | P-TYPE DIFFUSING AGENT COMPOSITION | PREVIOUSLY FORMED PATTERN | PATTERN FILM THICKNESS AFTER BAKING (μm) | | CALCINATION CONDITIONS | |
|---|---|---|---|---|---|---|
| | | | P-TYPE | N-TYPE | TEMPERATURE (° C.) | TIME (MIN) |
| EXAMPLE 1 | I | P-TYPE | 1.2 | 1 | 650 | 30 |
| EXAMPLE 2 | I | P-TYPE | 1.2 | 1 | 750 | 60 |
| EXAMPLE 3 | I | P-TYPE | 1.2 | 1 | 850 | 30 |
| EXAMPLE 4 | I | P-TYPE | 1.2 | 1 | 900 | 30 |
| EXAMPLE 5 | II | P-TYPE | 0.9 | 1 | 850 | 30 |
| EXAMPLE 6 | II | P-TYPE | 0.5 | 1 | 850 | 30 |
| EXAMPLE 7 | III | P-TYPE | 0.1 | 1 | 850 | 30 |
| EXAMPLE 8 | I | N-TYPE | 1.2 | 1 | 650 | 30 |
| EXAMPLE 9 | II | P-TYPE | 1.2 | 1 | 850 | 30 |
| EXAMPLE 10 | I | P-TYPE | 1.2 | 1 | 500 | 30 |
| COMPARATIVE EXAMPLE 1 | I | N-TYPE | 1.2 | 1 | WITHOUT CALCINATION | |
| COMPARATIVE EXAMPLE 2 | I | P-TYPE | 1.2 | 1 | WITHOUT CALCINATION | |

<P/N Determination>

As for the wafer 100 of each of the examples and comparative examples, the conductivity type of the impurity diffusion layer 104a corresponding to the P-type diffusing agent patterns 102a, the conductivity type of the impurity diffusion layer 104c corresponding to the P-type diffusing agent patterns 102c, the conductivity type of the impurity diffusion layer 104b corresponding to the N-type diffusing agent patterns 103a, and the conductivity type of the impurity diffusion layer 104d corresponding to the N-type diffusing agent patterns 103b were respectively classified into the conductivity type in the lower region of the P-type pattern and the conductivity type in the lower region of the N-type pattern and determined using a P/N judging machine (PN/12α: manufactured by Napson Corporation). The results are shown in Table 3.

<Measurement of Resistance Value>

As for the wafer 100 of each of the examples and comparative examples, the sheet resistance values Rs (Ω/sq) of the impurity diffusion layers 104a to 104d were measured by the four-point probe method using a sheet resistance measuring device (VR-70: manufactured by Kokusai Electric Co., Ltd.). An average of sheet resistance values of the impurity diffusion layers 104a and 104c was calculated and the obtained value was used as a sheet resistance value in the lower region of the P-type pattern. Further, an average of sheet resistance values of the impurity diffusion layers 104b and 104d was calculated and the obtained value was used as a sheet resistance value in the lower region of the N-type pattern. The results are shown in Table 3.

As for the lower region of the P-type pattern and the lower region of the N-type pattern, sheet resistance values at five points located at intervals of 1 mm in the short side direction in the central portion in the long side direction of each impurity diffusion layer were measured, and the standard deviation (σ) (Rs variation) was calculated. Generally, the Rs variation is preferred as it is lower. The case where the ratio is less than 10 is evaluated as "A", and the case where the ratio is 10 or more is evaluated as "B". The results are shown in Table 3.

<Measurement of Atomic Concentration Ratio>

The boron atom concentration (atm/cc) and the phosphorus atom concentration (atm/cc) in the central portion of the impurity diffusion layer 104c were measured using an SIMS analyser (CAMECA IMS-7f). In the measurement, a measurement depth of 0.01 micrometer was employed. The ratio (B/P) of the boron atom concentration to the phosphorus atom concentration was calculated as an atomic concentration ratio in the lower region of the P-type pattern. Similarly, the boron atom concentration (atm/cc) and the phosphorus atom concentration (atm/cc) in the central portion of the impurity diffusion layer 104b were measured. The ratio (P/B) of the phosphorus atom concentration to the boron atom concentration was calculated as the atomic concentration ratio in the lower region of the N-type pattern. Generally, the atomic concentration ratio is preferred as it is higher. The case where the ratio is 100 or more is evaluated as "A", the case where the ratio is 10 or more and less than 100 is evaluated as "B", and the case where the ratio is less than 10 is evaluated as "C". The results are shown in Table 3. In Comparative examples 1 and 2, the atomic concentration ratio was not measured.

TABLE 3

| | [LOWER REGION OF THE P-TYPE PATTERN] IMPURITY DIFFUSION LAYER 104a, 104c | | | | [LOWER REGION OF THE N-TYPE PATTERN] IMPURITY DIFFUSION LAYER 104b, 104d | | | |
|---|---|---|---|---|---|---|---|---|
| | P/N DETERMINATION | Rs (Ω/sq.) | Rs VARIATION | B/P | P/N DETERMINATION | Rs (Ω/sq.) | Rs VARIATION | P/B |
| EXAMPLE 1 | P | 181 | A | C | N | 35 | A | B |
| EXAMPLE 2 | P | 66 | A | A | N | 34 | A | A |
| EXAMPLE 3 | P | 55 | A | A | N | 43 | A | B |
| EXAMPLE 4 | P | 107 | A | A | N | 71 | A | B |
| EXAMPLE 5 | P | 36 | A | A | N | 53 | A | B |
| EXAMPLE 6 | P | 51 | A | B | N | 54 | A | B |
| EXAMPLE 7 | P | 171 | A | C | N | 47 | A | B |
| EXAMPLE 8 | P | 182 | B | C | N | 34 | A | B |

TABLE 3-continued

| | [LOWER REGION OF THE P-TYPE PATTERN] IMPURITY DIFFUSION LAYER 104a, 104c | | | | [LOWER REGION OF THE N-TYPE PATTERN] IMPURITY DIFFUSION LAYER 104b, 104d | | | |
|---|---|---|---|---|---|---|---|---|
| | P/N DETERMINATION | Rs (Ω/sq.) | Rs VARIATION | B/P | P/N DETERMINATION | Rs (Ω/sq.) | Rs VARIATION | P/B |
| EXAMPLE 9 | P | 28 | A | A | N | 42 | A | A |
| EXAMPLE 10 | P | 186 | A | C | N | 33 | A | B |
| COMPARATIVE EXAMPLE 1 | N | 92 | B | — | N | 59 | A | — |
| COMPARATIVE EXAMPLE 2 | N | 105 | B | — | N | 60 | A | — |

As shown in Table 3, in Comparative examples 1 and 2, the conductivity type in the lower region of the N-type pattern was an N-type. Although it is natural that the conductivity type in the lower region of the P-type pattern should be a P-type, it was an N-type. This is believed to be due to the fact that phosphorus in the N-type diffusing agent patterns 103a and 103b were diffused to the outside, absorbed into the P-type diffusing agent patterns 102a and 102b, and diffused in the impurity diffusion layers 104a and 104c. On the other hand, in Examples 1 to 10, the conductivity type in the lower region of the N-type pattern was an N-type, while the conductivity type in the lower region of the P-type pattern was a P-type. From this result, it was confirmed that out diffusion was suppressed by calcining the dispersing agent pattern of one conductivity type, forming the dispersing agent pattern of the other conductivity type, and performing simultaneous diffusion, and this allowed for selective diffusion of the impurity-diffusing component with high accuracy.

The Rs variation in the lower region of the P-type pattern in Examples 1 to 7, 9, and 10 where the P-type diffusing agent pattern was previously formed was smaller than that in Example 8 where the N-type diffusing agent pattern was previously formed. Accordingly, it was confirmed that a more excellent impurity diffusion layer could be formed by forming a P-type diffusing agent pattern containing boron before the formation of an N-type diffusing agent pattern containing phosphorus and calcining the P-type diffusing agent pattern. From the comparison among Examples 5, 6, and 9 where the film thickness of the P-type diffusing agent pattern was changed, it was confirmed that an excellent atomic concentration ratio could be obtained as the film thickness was larger, and further a lower sheet resistance value could be obtained.

For example, the embodiments based on the following combinations may be included in the scope of the present invention.

(Aspect 1)

A method of diffusing an impurity-diffusing component including: forming a first diffusing agent layer containing a first conductivity-type impurity diffusing component on the surface of a semiconductor substrate; calcining the first diffusing agent layer; forming a second diffusing agent layer containing a second conductivity-type impurity diffusing component on the surface of the semiconductor substrate excluding a region where the first diffusing agent layer is formed; and heating the semiconductor substrate at a temperature higher than a calcination temperature to diffuse the first conductivity-type impurity diffusing component and the second conductivity-type impurity diffusing component into the semiconductor substrate.

(Aspect 2)

The method of diffusing an impurity-diffusing component according to the aspect 1, wherein the first diffusing agent layer contains an alkoxy silane compound.

(Aspect 3)

The method of diffusing an impurity-diffusing component according to the aspect 1 or 2, wherein the first conductivity type is boron, and the second conductivity type is phosphorus.

(Aspect 4)

The method of diffusing an impurity-diffusing component according to any one of the aspects 1 to 3, wherein the first diffusing agent layer and the second diffusing agent layer are formed on the same surface of the semiconductor substrate.

(Aspect 5)

The method of diffusing an impurity-diffusing component according to any one of the aspects 1 to 4, wherein, in the calcining, the first diffusing agent layer is heated at a temperature of 500 to 900° C.

(Aspect 6)

A method of manufacturing a solar cell including: using a method of diffusing an impurity-diffusing component according to any one of the aspects 1 to 5 to diffuse a first conductivity-type impurity diffusing component and a second conductivity-type impurity diffusing component into a semiconductor substrate, and to form a first conductivity-type first impurity diffusion layer and a second conductivity-type second impurity diffusion layer on the surface of the semiconductor substrate; and forming a first electrode and a second electrode on the surface of the semiconductor substrate, electrically connecting the first electrode to the first impurity diffusion layer, and electrically connecting the second electrode to the second impurity diffusion layer.

What is claimed is:

1. A method of diffusing an impurity-diffusing component comprising:
    forming a first diffusing agent layer containing a first conductivity-type impurity diffusing component on the surface of a semiconductor substrate;
    calcining the first diffusing agent layer when the first diffusing agent layer is formed on the surface of the semiconductor substrate and while a second diffusing agent layer containing a second conductivity-type impurity diffusing component is not yet formed;
    forming the second diffusing agent layer on the surface of the semiconductor substrate excluding a region where the first diffusing agent layer is formed; and
    heating the semiconductor substrate at a temperature higher than a calcination temperature to diffuse the first conductivity-type impurity diffusing component and the second conductivity-type impurity diffusing component into the semiconductor substrate.

2. The method of diffusing an impurity-diffusing component according to claim 1, wherein the first conductivity type is boron, and the second conductivity type is phosphorus.

3. The method of diffusing an impurity-diffusing component according to claim 1, wherein the first diffusing agent layer and the second diffusing agent layer are formed on the same surface of the semiconductor substrate.

4. The method of diffusing an impurity-diffusing component according to claim 1, wherein, in the calcining, the first diffusing agent layer is heated at a temperature of 500° to 900° C.

5. The method of diffusing an impurity-diffusing component according to claim 1, wherein the first diffusing agent layer is formed using a P-type diffusing agent composition.

6. The method of diffusing an impurity-diffusing component according to claim 5, wherein the P-type diffusing agent composition contains borate ester and an alkoxy silane compound (C).

7. The method of diffusing an impurity-diffusing component according to claim 6, wherein the P-type diffusing agent composition further comprises a polyhydric alcohol (B).

8. The method of diffusing an impurity-diffusing component according to claim 7, wherein the polyhydric alcohol (B) is represented by Formula (2) below.

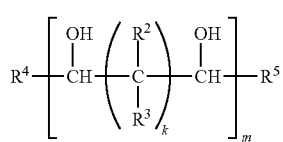

(2)

wherein k represents an integer of 0 to 3, m represents an integer of 1 or more, $R^2$ and $R^3$ independently represent a hydrogen atom, a hydroxyl group, an alkyl group having 1 to 5 carbon atoms or a hydroxyalkyl group having 1 to 5 carbon atoms, when there are a plurality of $R^2$s and a plurality of $R^3$s, the plurality of $R^2$s and the plurality of $R^3$s may be the same or different, when k is 2 or more, the plurality of $R^2$s and the plurality of $R^3$s necessarily include at least one hydroxyl group or a hydroxyalkyl group having 1 to 5 carbon atoms, and $R^4$ and $R^5$ independently represent a hydrogen atom or an alkyl group having 1 to 3 carbon atoms.

9. The method of diffusing an impurity-diffusing component according to claim 7, wherein the concentration of metal impurities contained in the P-type diffusing agent composition, except for metallic components contained in the borate ester, the polyhydric alcohol (B), and the alkoxy silane compound (C), is 500 ppb or less.

10. The method of diffusing an impurity-diffusing component according to claim 1, wherein the second diffusing agent layer is formed using an N-type diffusing agent composition.

11. The method of diffusing an impurity-diffusing component according to claim 10, wherein the N-type diffusing agent composition contains an impurity-diffusing component (A2) and an alkoxy silane compound (C).

12. The method of diffusing an impurity-diffusing component according to claim 11, wherein the impurity-diffusing component (A2) includes a compound of an element of Group V (Group 15).

13. A method of manufacturing a solar cell comprising:
using a method of diffusing an impurity-diffusing component comprising:
forming a first diffusing agent layer containing a first conductivity-type impurity diffusing component on the surface of a semiconductor substrate; calcining the first diffusing agent layer when the first diffusing agent layer is formed on the surface of the semiconductor substrate and while a second diffusing agent layer containing a second conductivity-type impurity diffusing component is not yet formed; forming the second diffusing agent layer on the surface of the semiconductor substrate excluding a region where the first diffusing agent layer is formed; and heating the semiconductor substrate at a temperature higher than a calcination temperature to diffuse the first conductivity-type impurity diffusing 1 the second conductivity-type impurity diffusing component into the semiconductor substrate, to form a first conductivity-type first impurity diffusion layer and a second conductivity-type second impurity diffusion layer on the surface of the semiconductor substrate by diffusing the first conductivity-type impurity diffusing component and the second conductivity-type impurity diffusing component into the semiconductor substrate; and
forming a first electrode and a second electrode on the surface of the semiconductor substrate, electrically connecting the first electrode to the first impurity diffusion layer, and electrically connecting the second electrode to the second impurity diffusion layer.

* * * * *